(12) United States Patent
Hirotsuru et al.

(10) Patent No.: US 9,387,532 B2
(45) Date of Patent: Jul. 12, 2016

(54) COMPOSITE SUBSTRATE FOR LED LIGHT EMITTING ELEMENT, METHOD OF PRODUCTION OF SAME, AND LED LIGHT EMITTING ELEMENT

(75) Inventors: Hideki Hirotsuru, Omuta (JP); Hideo Tsukamoto, Omuta (JP); Yosuke Ishihara, Omuta (JP)

(73) Assignee: Denka Company Limited, Tokyo (JP)

( * ) Notice: Subject to any disclaimer, the term of this patent is extended or adjusted under 35 U.S.C. 154(b) by 157 days.

(21) Appl. No.: 13/148,712

(22) PCT Filed: Feb. 10, 2010

(86) PCT No.: PCT/JP2010/051935
§ 371 (c)(1),
(2), (4) Date: Aug. 10, 2011

(87) PCT Pub. No.: WO2010/092972
PCT Pub. Date: Aug. 19, 2010

(65) Prior Publication Data
US 2011/0316040 A1 Dec. 29, 2011

(30) Foreign Application Priority Data
Feb. 13, 2009 (JP) ................................. 2009-031184

(51) Int. Cl.
*H01L 33/64* (2010.01)
*C04B 41/88* (2006.01)
(Continued)

(52) U.S. Cl.
CPC . *B22D 18/02* (2013.01); *B22F 3/26* (2013.01); *C04B 41/009* (2013.01); *C04B 41/52* (2013.01);
(Continued)

(58) Field of Classification Search
None
See application file for complete search history.

(56) References Cited

U.S. PATENT DOCUMENTS 4,988,645 A * 1/1991 Holt et al. .................... 501/91
5,218,216 A 6/1993 Manabe et al.
(Continued)

FOREIGN PATENT DOCUMENTS

CN 101097984 A 1/2008
EP 1 973 157 A1 9/2008
(Continued)

OTHER PUBLICATIONS

Translation of Full Contents of Yamada et al, JP-2004288788 from the Japan Patent Office (computerized translation from AIPN tool, from website http://dossier1.ipdl.inpit.go.jp/AIPN/odse_top_dn.ipdl?N0000=7400.*
(Continued)

*Primary Examiner* — Johannes P Mondt
(74) *Attorney, Agent, or Firm* — Oblon, McClelland, Maier & Neustadt, L.L.P.

(57) ABSTRACT

A substrate for an LED light emitting element having a small difference of linear thermal expansion coefficient with the III-V semiconductor crystal constituting an LED, having an excellent thermal conductivity, and suitable for high output LEDs. A porous body comprises one or more materials selected from silicon carbide, aluminum nitride, silicon nitride, diamond, graphite, yttrium oxide, and magnesium oxide and has a porosity that is 10 to 50 volume % and a three-point bending strength that is 50 MPa or more. The porous body is infiltrated, by means of liquid metal forging, with aluminum alloy or pure aluminum at an infiltration pressure of 30 MPa or more, cut and/or ground to a thickness of 0.05 to 0.5 mm and to a surface roughness (Ra) of 0.01 to 0.5 μm, then is formed with a metal layer comprising one or more elements selected from Ni, Co, Pd, Cu, Ag, Au, Pt and Sn on its surface to a thickness of 0.5 to 15 μm, so as to thereby produce the composite substrate for the LED light emitting element.

13 Claims, 1 Drawing Sheet

(51) Int. Cl.
  *B22D 18/02* (2006.01)
  *C04B 41/00* (2006.01)
  *C04B 41/52* (2006.01)
  *C04B 41/90* (2006.01)
  *B22F 3/26* (2006.01)
  *C22C 26/00* (2006.01)
  *C22C 29/06* (2006.01)
  *C22C 29/12* (2006.01)
  *C22C 29/16* (2006.01)

(52) U.S. Cl.
  CPC ............... *C04B 41/90* (2013.01); *C22C 26/00* (2013.01); *C22C 29/06* (2013.01); *C22C 29/12* (2013.01); *C22C 29/16* (2013.01); *B22F 2998/10* (2013.01); *H01L 33/641* (2013.01); *H01L 2924/0002* (2013.01); *Y10T 428/12007* (2015.01)

(56) References Cited

U.S. PATENT DOCUMENTS

| | | | |
|---|---|---|---|
| 6,399,187 B1* | 6/2002 | Terasaki et al. | 428/307.7 |
| 6,447,894 B1* | 9/2002 | Hirotsuru et al. | 428/307.7 |
| 6,649,265 B1* | 11/2003 | Kawamura et al. | 428/408 |
| 2001/0031345 A1* | 10/2001 | Araki et al. | H01L 23/3733 428/209 |
| 2005/0167792 A1* | 8/2005 | Miyai et al. | 257/668 |
| 2006/0091409 A1 | 5/2006 | Epler et al. | |
| 2006/0118808 A1* | 6/2006 | Ishidu et al. | 257/100 |
| 2006/0183625 A1* | 8/2006 | Miyahara | 501/98.4 |
| 2008/0121910 A1* | 5/2008 | Bergmann et al. | 257/98 |
| 2008/0157347 A1* | 7/2008 | Takashima | 257/712 |
| 2008/0251798 A1 | 10/2008 | Ogihara et al. | |
| 2009/0151982 A1* | 6/2009 | Oshika | 174/126.2 |

FOREIGN PATENT DOCUMENTS

| | | | | |
|---|---|---|---|---|
| EP | 2 325 153 A1 | 5/2011 | | |
| JP | 3-61556 A | 3/1991 | | |
| JP | 5 073252 | 10/1993 | | |
| JP | 2004 288788 | 10/2004 | | |
| JP | 2005 117006 | 4/2005 | | |
| JP | 2006-76812 | 3/2006 | | |
| JP | 2006 128710 | 5/2006 | | |
| JP | 2007-314423 A | 12/2007 | | |
| JP | 2008 98526 | 4/2008 | | |
| JP | 2008-263126 A | 10/2008 | | |
| WO | WO-2006132087 A1 * | 12/2006 | ............ | H01S 5/022 |

OTHER PUBLICATIONS

L.I. Berger, "Electrical Resistivities of Graphite Materials", CRC Handbook of Chemistry and Physics, $94^{th}$ edition, p. 12-46 (2013-2014).*

CRC Handbook of Chemistry and Physics, $94^{th}$ edition, "Electrical Resistivities of Pure Metals", pp. 12-41 and 12-42, $94^{th}$ edition, 2013-2014.*

Harbich et al., "X-ray refraction characterization of non-metallic materials", NDT&E International, vol. 34, pp. 297-302 (2001), Elsevier Science Ltd.*

ADC12 composition, in ASM Alloy Data Base, ASM International 2015, from Alloy Finder (http://mio.asminternational.org/ac/).*

Hammond, C.R., "The Elements", CRC Handbook, 96th Edition (2015-2016).*

International Search Report issued Mar. 23, 2010 in PCT/JP10/051935 filed Feb. 10, 2010.

Extended European Search Report issued Oct. 14, 2014 in Patent Application No. 10741249.6.

* cited by examiner

COMPOSITE SUBSTRATE FOR LED LIGHT EMITTING ELEMENT, METHOD OF PRODUCTION OF SAME, AND LED LIGHT EMITTING ELEMENT

TECHNICAL FIELD

The present invention relates to a composite material substrate for light emitting diode (hereinafter referred to as "LED") elements, a method of production thereof, and an LED light emitting element using the composite material substrate.

BACKGROUND ART

LEDs are elements that emit light upon passing a forward electric current across a pn junction of a semiconductor, produced using crystals of III-V semiconductors such as GaAs, GaN and the like. In recent years, progress in semiconductor epitaxial growth techniques and light-emitting element processing techniques has resulted in development of LEDs excelling in conversion efficiency, used widely in various fields.

LEDs are composed of a p-type layer and n-type layer formed by epitaxial growth of III-V semiconductor crystals on a monocrystalline growth substrate, and a photoactive layer sandwiched therebetween. Generally, LED light emitting elements are formed by epitaxially growing a III-V semiconductor crystal such as GaN on a growth substrate of monocrystalline sapphire or the like, then forming electrodes and the like (Patent Document 1).

When epitaxially growing III-V semiconductor crystals on a monocrystalline growth substrate, it can be difficult to achieve good single crystal growth due to differences in lattice constant between the monocrystalline growth substrate and the III-V semiconductor crystal. For this reason, a method of forming a buffer layer of GaN or the like at a low temperature on the sapphire substrate, and epitaxially growing GaN thereon has been proposed (Patent Document 2). However, even when this technique is used, the difference in coefficient of linear thermal expansion between the sapphire substrate and the buffer layer of GaN or the like can cause warping of the substrate after epitaxial growth, and in the worst case, the substrate may even crack. Therefore, there is a need for substrate materials having coefficient of linear thermal expansion close to those of III-V semiconductor crystals.

Additionally, monocrystalline growth substrates such as monocrystalline sapphire substrates have the problem of poor thermal conductivity. In the case of monocrystalline sapphire, the thermal conductivity is about 40 W/mK, which is not sufficient to adequately dissipate the heat generated by III-V semiconductor elements of GaN or the like. In particular, the device temperature can rise in high-output LEDs that carry a large current, reducing light emission efficiency and shortening the device lifespan. In response, a method involving epitaxial growth of III-V semiconductor crystals on a monocrystalline growth substrate followed by bonding of a substrate with high thermal conductivity via a metal layer, followed by removal of the monocrystalline growth substrate has been proposed (Patent Document 3). For this reason, materials excelling in thermal conductivity such as copper have been considered as potential high thermal conductivity substrates, but their coefficients of linear thermal expansion differ greatly from those of III-V semiconductor crystals, so they have not proven satisfactory for use with high-output LEDs.

Patent Document 1: JP 2005-117006 A
Patent Document 2: JP H5-73252 B
Patent Document 3: JP 2006-128710 A

SUMMARY OF THE INVENTION

Therefore, the present invention has the purpose of offering a substrate for LED light emitting elements having a coefficient of linear thermal expansion differing little from that of III-V semiconductor crystals constituting LEDs, excelling in thermal conductivity, and favorable for use in high-output LEDs, as well as a method of production thereof.

Additionally, the present invention has the purpose of offering a method of production of an LED light emitting element using such a substrate for LED light emitting elements, and an LED light emitting element produced by such a method.

In one aspect, the present invention offers a composite material substrate for LED light emitting elements, formed by infiltrating, with an aluminum alloy or pure aluminum, a porous body having a porosity of 10 to 50 vol % and consisting of one or more materials chosen from among silicon carbide, aluminum nitride, silicon nitride, diamond, graphite, yttrium oxide and magnesium oxide, working to a composite material of predetermined thickness and surface roughness, then forming, on a surface, a metal layer comprising one or more metals chosen from among Ni, Co, Pd, Cu, Ag, Au, Pt and Sn to a thickness of 0.5 to 15 µm. In another aspect, said porous body has a three-point bending strength of at least 50 MPa, and said porous body is infiltrated with said aluminum alloy by squeeze casting at an infiltration pressure of at least 30 MPa. In one embodiment, said composite material has a thickness of 0.05 to 0.5 mm, and a surface roughness (Ra) of 0.01 to 0.5 µm. In another embodiment, said composite material has a thickness of 0.05 to 0.5 µm and a surface roughness (Ra) of 0.01 to 2 µm, and one surface is worked to a surface roughness (Ra) of 0.01 to 0.5 µm after formation of said metal layer.

Additionally, in a preferred embodiment of the present invention, the composite material substrate has a thermal conductivity of 100 to 500 W/mK at a temperature of 25° C., a coefficient of linear thermal expansion of 4 to $9 \times 10^{-6}$/K at a temperature of 25° C. to 150° C., a three-point bending strength of at least 50 MPa, and a volume resistivity of $10^{-9}$ to $10^{-5}$ Ω-m. Additionally, in another embodiment, the composite material substrate has a thickness of 0.05 mm to 0.5 mm, a surface roughness (Ra) of 0.01 to 0.5 µm on at least one main surface, and a weight decrease of at most 0.2 mg/cm$^2$ on at least one main surface when immersed for 1 minute respectively in a 5N HCl solution at a temperature of 25° C. and a 10N NaOH solution at a temperature of 75° C.

In another aspect, the present invention offers a method of production of a composite material substrate for LED light emitting elements, comprising the steps of:

(a) preparing a porous body having a porosity of 10 to 50 vol % and consisting of one or more materials chosen from among silicon carbide, aluminum nitride, silicon nitride, diamond, graphite, yttrium oxide and magnesium oxide;

(b) forming a composite material by infiltrating said porous body with an aluminum alloy or pure aluminum and working to a predetermined thickness and surface roughness; and (c) forming, on a surface of said composite material, a metal layer comprising one or more metals chosen from among Ni, Co, Pd, Cu, Ag, Au, Pt and Sn, to a thickness of 0.5 to 15 µm.

In one embodiment, in step (a), said porous body has a three-point bending strength of at least 50 MPa, and in step (b), said porous body is infiltrated with said aluminum alloy or pure aluminum by squeeze casting at an infiltration pressure of at least 30 MPa. In another embodiment, in step (b), the composite material is worked to a thickness of 0.05 to 0.5 mm and a surface roughness (Ra) of 0.01 to 0.5 µm. In yet another embodiment, in step (b), the composite material is worked to a thickness of 0.05 to 0.5 mm and a surface roughness (Ra) of 0.01 to 2 µm, and in step (c), one surface of the composite material on which the metal layer is formed is worked to a surface roughness (Ra) of 0.01 to 0.5 µm.

In a further embodiment, the present invention offers a method of production of an LED light emitting element, comprising the steps of:

(1) epitaxially growing a III-V semiconductor crystal on one main surface of a disc-shaped or plate-shaped monocrystalline growth substrate;

(2) bonding said composite material substrate for LED light emitting elements according to the present invention onto the surface of said III-V semiconductor crystal via a metal layer, then removing said monocrystalline growth substrate by one of the methods of laser irradiation, etching and grinding; and (3) working the surface of the III-V semiconductor crystal on the side where said monocrystalline growth substrate has been removed to form electrodes, then cutting.

In one embodiment, the monocrystalline growth substrate is composed of a material chosen from the group consisting of monocrystalline sapphire, monocrystalline silicon carbide, monocrystalline GaAs and monocrystalline Si. In another embodiment, the monocrystalline growth substrate is surface coated with a material chosen from the group consisting of AlN, SiC, GaN and GaAs. In yet another embodiment, the III-V semiconductor crystal is one of GaN, GaAs and GaP. Furthermore, the present invention also discloses an LED light emitting element producible by any of the above-described methods of production of an LED light emitting element.

The present invention offers a composite material substrate for LED light emitting elements having high thermal conductivity and a coefficient of linear thermal expansion that differs little from that of III-V semiconductor crystals constituting LEDs. By using this composite material substrate for LED light emitting elements, a high output LED light emitting element excelling in heat dissipation and reliability can be obtained. Furthermore, the composite material substrate for LED light emitting elements according to the above constitution excels in chemical resistance to acid and alkali solutions used during production of LED light emitting elements, and is electroconductive, enabling electrodes to be formed on both surfaces of the III-V semiconductor crystal constituting an LED. As a result, it is capable of achieving reductions in LED emitting element production processes and increasing the light emitted per unit area.

MODES FOR CARRYING OUT THE INVENTION

Figure 1:
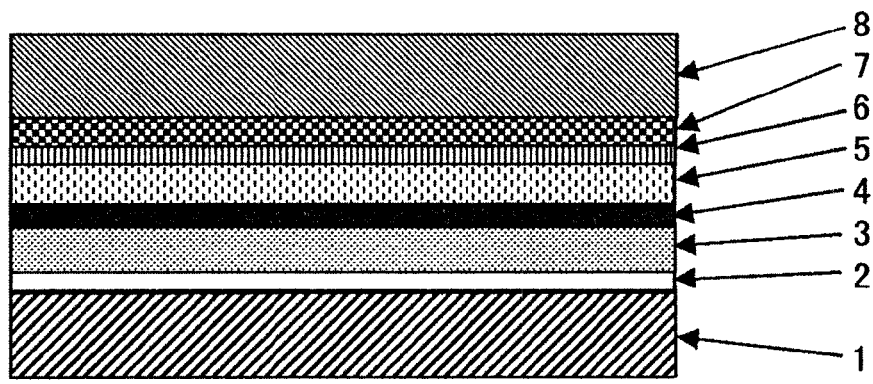
FIG. 1 A schematic section view for explaining an example of the structure of an LED light emitting element according to Example 1 of the present invention, wherein a composite material substrate according to an embodiment of the present invention has been bonded to a semiconductor layer formed via a buffer layer on a sapphire growth substrate.

The present invention relates to an LED light emitting element and a composite material substrate used for such an LED light emitting element. Herebelow, the production of the LED light emitting element will be explained, in the process of which the production of the composite material substrate will also be described.

In an embodiment of the present invention, an LED light emitting element is produced using a monocrystalline growth substrate, a III-V semiconductor crystal and a composite material substrate.

The monocrystalline growth substrate must consist of a material having a lattice constant that differs little from epitaxially grown III-V semiconductor crystals, and having few defects. Usually, worked monocrystalline materials are used for crystallinity and uniformity. These monocrystalline growth substrates must be capable of withstanding the temperature and atmosphere during the process of epitaxial growth of III-V semiconductor crystals. For this reason, the material used in the monocrystalline growth substrates of the present invention should preferably be chosen from the group consisting of monocrystalline sapphire, monocrystalline silicon carbide, monocrystalline GaAs and monocrystalline Si. Furthermore, the monocrystalline growth substrate used in the present invention should preferably be surface-coated with a material chosen from the group consisting of AlN, SiC, GaN and GaAs.

The III-V semiconductor crystals constituting the LED should preferably be one of GaN, GaAs and GaP in view of the conversion efficiency as an LED light emitting element. These III-V semiconductor crystals achieve high light emission efficiency and are chosen depending on the application. Additionally, the III-V semiconductor crystals are chosen according to the optimal light emission wavelength for each application.

In one embodiment of the present invention, a III-V semiconductor crystal is deposited by epitaxial growth on a main surface of a monocrystalline growth substrate. The epitaxial growth of the III-V semiconductor crystals should preferably be performed by metal organic chemical vapor deposition (MOCVD) or hydride vapor phase epitaxy (HVPE). MOCVD is suited to growing III-V semiconductor crystals of good crystallinity, while HVPE has a fast crystal growth rate and is capable of efficiently growing III-V semiconductor crystals. These methods are publicly known and the conditions can be set a appropriate. However, the method of epitaxial growth is not limited to the aforementioned methods as long as the method is capable of growing III-V semiconductor crystals.

The epitaxially grown III-V semiconductor crystals may also be subjected to surface treatments to further improve the light emission properties. Additionally, the surfaces may be etched or polished to improve the uniformity of the crystal surface. In the present invention, a composite material substrate according to the present invention is bonded to the surface of an epitaxially grown III-V semiconductor crystal, but before that, a metal layer is formed on the surface of the III-V semiconductor crystal by a technique such as vapor deposition, sputtering or the like. The metal layer should preferably be formed using indium, aluminum, gold, silver or an alloy thereof. Regarding the thickness of the metal layer, since the coefficient of linear thermal expansion of the metal differs from that of the III-V semiconductor layer, excessive thickness will reduce the closeness of contact and is thus not preferable. The metal layer should preferably not have a low thermal conductivity in order to achieve good heat dissipation. For this reason, the thickness of the metal layer should preferably be 0.5 to 10 µm and more preferably 0.5 to 2 µm.

Next, in order to bond the III-V semiconductor crystal, a metal layer is similarly formed by vapor deposition or sputtering on the surface of the composite material substrate that is to be bonded to the III-V semiconductor crystal. This metal layer, like the metal layer on the surface of the III-V semiconductor crystal, should preferably be formed using indium, aluminum, gold, silver or an alloy thereof. The properties demanded of the composite material substrate are (1) that it have adequate strength to withstand bonding, and (2) that the bonding surface be free of voids and intermediaries such as contaminants, and that the bonding surface be flat. In order to satisfy condition (1), the three-point bending strength of the composite material substrate must be at least 50 MPa, preferably at least 200 MPa. In order to satisfy condition (2), the surface roughness (Ra) of the composite material substrate must be 0.01 to 0.5 µm, preferably 0.01 to 0.2 µm.

The bonding of the III-V semiconductor crystal and the composite material substrate is performed by heating with the bonding surfaces set together while applying pressure as needed. While the heating temperature will differ depending on the type of metal layer, it will generally be 250° C. to 550° C. The pressure applied will generally be 2 to 20 MPa.

Since the composite material substrate is used by bonding with a III-V semiconductor crystal, it is important for the difference in coefficient of linear thermal expansion between the materials to be small. For this reason, the coefficient of linear thermal expansion of the composite material substrate at temperatures of 25° C. to 150° C. should preferably be 4 to $9 \times 10^{-6}$/K, more preferably 4 to $7 \times 10^{-6}$/K. When the coefficient of linear thermal expansion of the composite material substrate at temperatures of 25° C. to 150° C. lies outside the range of 4 to $9 \times 10^{-6}$/K, warping may occur after bonding, the bonding layer may become separated when used as an LED light emitting element, or the III-V semiconductor crystal may crack.

The composite material substrate of the present invention will form the base substrate of an LED light emitting element. Since most of the heat generated by the III-V semiconductor element will be dissipated through this substrate, the substrate must have a good heat dissipation properties. For this reason, the thermal conductivity of the composite material substrate at a temperature of 25° C. should preferably be 100 to 500 W/mK, more preferably 130 to 500 W/mK. If the thermal conductivity is less than 100 W/mK, the heat generated by the III-V semiconductor element will not be able to be adequately dissipated, and particularly in the case of high-output LEDs requiring a large current, the temperature of the element may rise, leading to reduced light emission efficiency and shorter element lifespan. On the other hand, regarding the upper limit of thermal conductivity, there are no constraints in terms of the properties themselves, but the substrate materials can become prohibitively expensive.

Additionally, while the composite material substrate should preferably be thin for heat dissipation, it requires adequate strength to hold the III-V semiconductor element and to withstand handling and the like during production of the LED light emitting element, so a certain thickness is necessary. In one embodiment, the thickness of the composite material substrate is preferably 0.05 mm to 0.5 mm, more preferably 0.05 mm to 0.3 mm. The thickness of the composite material substrate should preferably not exceed 0.5 mm, since that will reduce the heat dissipation properties of the LED light emitting element. The composite material substrate of the present invention can also be bonded to the III-V semiconductor crystal, then afterwards thinned by polishing or the like as needed.

In the present invention, the monocrystalline growth substrate is removed after bonding the III-V semiconductor crystal and the composite material substrate by a metal layer. The monocrystalline growth substrate is generally removed by laser irradiation from the monocrystalline growth substrate side. Aside therefrom, the monocrystalline growth substrate can be removed by polishing or etching. The surface of the III-V semiconductor crystal surface with the monocrystalline growth substrate removed may be polished or etched as needed to attain a desired surface shape, and electrodes may be formed by techniques such as vapor deposition and sputtering. They can then be further cut with lasers or diced to form predetermined shapes, thereby resulting in LED light emitting elements.

The composite material substrate of the present invention requires chemical resistance during the LED light-emitting element production process. Specifically, the weight decrease per unit area on at least one main surface when immersed for 1 minute respectively in a 5N LED solution at a temperature of 25° C. and a 10N NaOH solution at a temperature of 75° C. should preferably be 0.2 mg/cm$^2$ or less, and more preferably, the weight decrease should be 0.1 mg/cm$^2$ or less. When the weight decrease per unit area on at least one main surface when immersed for 1 minute respectively in a 5N HCl solution at a temperature of 25° C. and a 10N NaOH solution at a temperature of 75° C. exceeds 0.2 mg/cm$^2$, the properties such as thermal conductivity may be reduced due to elution of metal components from the composite material, and chipping may occur when cutting by laser or dicing to predetermined shapes, thereby reducing the yield of the LED light emitting elements. During actual use of the composite material substrate of the present invention, one main surface of the composite material substrate is bonded to a III-V semiconductor crystal by a metal layer, so it is sufficient for the non-bonded surface to satisfy the above-mentioned chemical resistance properties.

In the composite material substrate of the present invention, the substrate itself is conductive. Therefore, electrodes can be formed on both surfaces of the III-V semiconductor crystal constituting an LED. While conventional methods using insulating materials such as sapphire substrates as substrates require some of the p-type or n-type III-V semiconductor crystal at the top to be removed by etching in order to form electrodes on the same face, the present invention does not require this, and is therefore capable of simplifying the LED light emitting element production process. Furthermore, since there is no need to remove some of the either the p-type or n-type III-V semiconductor crystal by etching or the like to form electrodes, the amount of emitted light per unit area of the LED light emitting element can be increased. The volume resistivity of the composite material in the present invention should preferably be $10^{-9}$ to $10^{-5}$ Ω-m. The volume resistivity should preferably not exceed $10^{-5}$ Ω-m, since that may reduce the light emission efficiency. While there are no constraints on the lower limit of the volume specificity in terms of the properties themselves, it is usually at least $10^{-9}$ Ω-m based on the material composition.

The method of production of a composite material substrate having the above-mentioned properties shall be explained below.

The methods for production of a composite material used for the composite material substrate can be largely divided into infiltration and powder metallurgy. Of these, infiltration has actually been used in products for properties such as thermal conductivity. There are also various infiltration techniques, including methods performed at standard pressure and methods performed at high pressure (high-pressure forging). High-pressure forging includes squeeze casting and die-casting. The method favorable for the present invention is high-pressure forging involving infiltration at high pressure, among which squeeze casting is especially preferred for obtaining a fine composite excelling in properties such as thermal conductivity. Squeeze casting is a method wherein a high-pressure vessel is filled with a ceramic powder or molded article, which is then infiltrated with a melt of an aluminum alloy or the like at high temperature and high pressure to form a composite material.

Therefore, in an embodiment of the present invention, the composite material is produced by squeeze casting. The raw material ceramics must have a high thermal conductivity and a low coefficient of linear thermal expansion. Accordingly, in the present invention, one or more materials chosen from silicon carbide, aluminum nitride, silicon nitride, diamond, graphite, yttrium oxide and magnesium oxide are used. The composite material of the present invention can be adjusted to have a thermal conductivity and coefficient of linear thermal expansion within the above-described ranges by infiltrating the ceramics with an aluminum alloy or pure aluminum to form a composite. In one embodiment, the composite material is a composite material containing these ceramics in an amount of 50 to 90 vol %, with the remainder consisting of an aluminum alloy or pure aluminum. The ceramic content is preferably 70 to 85 vol %. If the ceramic content is less than 50 vol %, the coefficient of linear thermal expansion of the resulting composite material will be too large, making it unsuitable for use as a substrate material for an LED light emitting element. On the other hand, if the ceramic content exceeds 90 vol %, the aluminum alloy or pure aluminum will not be able to adequately penetrate when forming the composite, as a result of which the thermal conductivity will become too low.

While the ceramics may be used in the form of a powder, it is preferable to mold them using an inorganic hinder, or to produce a porous body (hereinafter referred to as a "preform") having a porosity of 10-50 vol % by means of sintering when forming the composite. The porosity of the preform may be adjusted by adjusting the granularity of the raw material powder, the molding pressure, the sintering conditions, and the like. The method of molding the preform may be any common method of molding ceramic powders, such as press molding and cast molding. Additionally, the preform may be shaped into a flat plate or cylinder as needed. Furthermore, in an embodiment of the present invention, a preform having a three-point bending strength of at least 50 MPa is preferably used in order to work it into a plate of thickness 0.05 mm to 0.5 mm as the final shape. If the strength of the preform is inadequate, warping may occur when working to a plate of thickness 0.05 mm to 0.5 mm by grinding.

The preforms are mounted using jigs coated with a mold release agent, a plurality being stacked and connected by bolts and nuts or the like to form a stacking block. The jigs for mounting the performs may be jigs formed of iron or graphite. Additionally, the respective jigs may hold mold release plates coated with a mold release agent, which are stacked to form a stacking block. The mold release plates may be stainless steel plates or ceramic plates, and are not particularly limited as long as they are dense materials into which the aluminum ally will not penetrate during squeeze casting. Additionally, the mold release agent coating the jigs and mold release plates may be a mold release agent of graphite, boron nitride, alumina or the like. Furthermore, the surfaces of the jigs or mold release plates should preferably be coated with an alumina sol or the like before coating with the mold release agent.

The resulting stacking blocks are heated at a temperature of about 600 to 800° C., then one or more are positioned inside a high pressure vessel, and as quickly as possible in order to prevent the temperature of the stacking blocks from falling, an aluminum alloy melt heated to above the melting point is poured and compressed at a pressure of at least 30 MPa to infiltrate the gaps in the preform with the aluminum alloy, resulting in the composite material. The infiltrated product may also be annealed for the purpose of removing residual stress occurring during infiltration.

If the heating temperature of the stacking block is less than 600° C., the aluminum alloy will be inadequately composited, reducing the properties such as thermal conductivity of the resulting composite material. Additionally, when the heating temperature exceeds 800° C., oxidation may occur at the surface of the ceramic powder during when compositing with the aluminum alloy, thereby reducing the properties such as thermal conductivity of the resulting composite material. Furthermore, the pressure during infiltration is preferably not less than 30 MPa, in which case the aluminum alloy will be inadequately composited, thereby reducing the properties such as thermal conductivity of the resulting composite material. The infiltration pressure is preferably at least 50 MPa.

While the aluminum alloy in the composite material used for the composite material substrate of the present invention may be of any type as long as it is an aluminum alloy that is used in the relevant field, the aluminum alloy preferably contains at least 70 mass % of aluminum in one embodiment. The aluminum content is preferably not less than 70 mass %, in which case the thermal conductivity of the aluminum alloy may be too low. Additionally, the aluminum alloy should preferably have a low melting point in order to be capable of fully penetrating into the spaces in the preform during infiltration. An example of such an aluminum alloy is an aluminum alloy comprising 5-25 mass % of silicon. By further adding 0.3 to 2.0 mass % of magnesium, the bond between the ceramic and metallic portions will be stronger. Regarding the metallic components in the aluminum alloy other than aluminum, silicon and magnesium, there are no particular limitations as long as they are within such a range as not to overly change the properties. For example, copper or the like may be included.

Next, an example of a method of working the resulting composite material will be explained. When the resulting composite material is in the form of a cylinder, it is externally shaped to predetermined dimensions using a cylindrical grinder with a diamond grindstone, then cut to a thickness of about 0.1 to 0.5 mm thicker than the final shape using a multi-wire saw, an inner diameter blade or the like. While the cutting method is not particularly limited, a multi-wire saw is preferably used due to the low cutting cost and suitability for mass production. When cutting with a multi-wire saw, it may be of free abrasive grain type and use a wire having a grinding material such as diamonds attached. After cutting, the surface of the plate-shaped composite material is worked using a machine tool such as a two-sided grinder, a rotary grinder, a planar grinder or a lapping machine to a thickness of 0.05 to 0.5 mm and a surface roughness (Ra) of 0.01 to 0.5 µm. When working the surface, the processes using the two-sided grinder, rotary grinder, planar grinder or the like may be followed by finishing with a lapping machine in order to further reduce the surface roughness. Additionally, when the composite material substrate of the present invention is to be polished after bonding with the III-V semiconductor crystal during the LED light emitting element production stage, it is possible to work only one surface (the bonding surface) of the composite material substrate to a predetermined surface roughness.

When the resulting composite material is in the form of a plate, the surface is worked using a machine tool such as a two-sided grinder, a rotary grinder, a planar grinder or a lapping machine to a thickness of 0.05 to 0.5 mm and a surface roughness (Ra) of 0.01 to 0.5 μm, then the periphery is worked to a predetermined shape using a water-jet cutter, a discharge cutter, a laser cutter, a dicing machine or a cylindrical grinder. When the resulting composite material is in the form of a plate, it is also possible to first work the periphery to a predetermined shape using a water-jet cutter, a discharge cutter, a laser cutter, a dicing machine or a cylindrical grinder, then work the surface using a machine tool such as a two-sided grinder, a rotary grinder, a planar grinder or a lapping machine to a thickness of 0.05 to 0.5 mm and a surface roughness (Ra) of 0.01 to 0.5 μm.

Next, after cleaning the surface of the composite material which has been worked into the form of a plate having a predetermined thickness and surface roughness as indicated above, a metal layer of 0.5 to 15 μm containing at one or more metals chosen from among Ni, Co, Pd, Cu, Ag, Au, Pt and Sn is formed on the surface. The metal layer thickness is preferably not 0.5 μm or less, in which case pinholes may occur on the metal layer, reducing the chemical resistance. On the other hand, the metal layer thickness preferably does not exceed 15 μm, in which case separation may occur due to the difference in thermal expansion between the metal layer and the composite material, or the coefficient of linear thermal expansion of the composite material having the resulting metal layer may be too high. The thickness of the metal layer is more preferably 2 to 10 μm. The material of the metal layer may be one or more metals chosen from among Ni, Co, Pd, Cu, Ag, Au, Pt and Sn, and metal composites thereof may also be used. Additionally, the metal layer may contain non-metallic elements such as P and B. The technique for applying the metal layer will generally be electroless plating or electroplating. The surface of the plate-shaped composite material may also be covered by the above-mentioned metals by non-plating techniques such as vapor deposition.

Additionally, two plate-shaped composite materials may be bonded by a wax or adhesive, their surfaces cleaned, a metal layer of thickness 0.5 to 15 μm of one or more metals chosen from among Ni, Co, Pd, Cu, Ag, Au, Pt and Sn formed on the surface by electroless plating or electroplating, and the wax or adhesive removed to form a plate-shaped composite material having metal layers formed on one main surface and the side surfaces.

Furthermore, one main surface of a plate-shaped composite material may be covered by an organic sheet or resist, the surface cleaned, a metal layer of thickness 0.5 to 15 μm of one or more metals chosen from among Ni, Co, Pd, Cu, Ag, Au, Pt and Sn formed on the surface by electroless plating or electroplating, and the covering layer removed to form metal layers on one main surface and the side surfaces of the plate-shaped composite material.

Additionally, the composite material may be peripherally worked and cut into the shape of a board to form a composite material with a thickness of 0.05 to 0.5 mm and a surface roughness (Ra) of 0.01 to 0.2 μm, the surface cleaned, then electroless plated or electroplated to form a metal layer of thickness 0.5 to 15 μm of one or more metals chosen from among Ni, Co, Pd, Cu, Ag, Au, Pt and Sn. Next, one main surface may be worked to a surface roughness (Ra) of 0.01 to 0.5 μm using a lapping machine or the like.

Herebelow, the present invention will be explained in detail by providing examples, but the examples should not be construed as limiting the present invention.

EXAMPLES

Example 1

<Preparation of Composite Material Substrate for LED Light Emitting Element>

1800 g of a silicon carbide (hereinafter referred to also as SiC) powder A (Pacific Rundum NG-60, average grain size 200 μm), 900 g of a silicon carbide powder B (Pacific Rundum NG-600, average grain size 20 μm), 300 g of silicon carbide powder C (Pacific Rundum NG-6000, average grain size 2 μm) and 150 g of a molding binder (methylcellulose, Shin-etsu Chemical Metolose) were measured out, mixed for 30 minutes in an agitation mixer, then press-molded at a surface pressure of 10 MPa into the shape of a cylinder of dimensions $\phi$55 mm×110 mm, then CIP-molded at a molding pressure of 100 MPa to produce a molded article.

The resulting molded article was degreased for 2 hours at a temperature of 600° C. in air, then baked for 2 hours at a temperature of 2100° C. in an argon atmosphere to produce an SiC preform of porosity 20%. The resulting SiC preform was worked using a diamond grindstone in a machining center to a form having outer dimensions $\phi$52 mm×100 mm. This was further ground to produce a three-point bending strength measuring sample (3 mm×4 mm×40 mm), and the three-point bending strength was measured. The three-point bending strength was 120 MPa.

A boron nitride mold release agent was applied to the resulting SiC preform, which was then inserted into a tubular graphite jig of outer dimensions 70 mm×70 mm×100 mm (inner dimensions 52.5 mm×100 mm) to form a structure. Next, a graphite mold release material was applied to a stainless steel plate of 70 mm×100 mm×0.8 mmt to form a mold release plate, four structures were stacked with the mold release plate sandwiched in between to form a shape of dimensions 140.8 mm×140.8 mm×100 mm, and 12 mm thick iron plates were provided on both sides and joined by eight M10 bolts to result in a single stacking block. Next, the stacking block was preheated to a temperature of 700° C. in an electrical furnace, then placed in a preheated press mold of inner dimensions $\phi$400 mm×300 mmH, an aluminum alloy melt (temperature 800° C.) containing 12 mass % of silicon and 1 mass % of magnesium was poured in, and the stacking block was compressed for 25 minutes at a pressure of 100 MPa to infiltrate the SiC preform with the aluminum alloy. After cooling to room temperature, the stacking block was cut along the shape of the mold release plates using a wet band-type saw, the mold release plates were stripped, and the graphite jig portions were removed using a lathe to result in a composite material of dimensions $\phi$52 mm×100 mm. The resulting composite material was annealed for three hours at a temperature of 530° C. to remove residual stress from infiltration.

Next, the resulting composite material was ground to produce a sample for measuring the coefficient of thermal expansion (diameter 3 mm, length 10 mm), a sample for measuring thermal conductivity (25 mm×25 mm×1 mm), a sample for measuring the three-point bending strength (3 mm×4 mm×40 mm) and a sample for measuring the volume resistivity (50 mm×50 mm×5 mm). The respective samples were used to measure the coefficient of thermal expansion at temperatures of 25° C. to 150° C. (Seiko Electronics TMA 300), the thermal conductivity at a temperature of 25° C. using a laser flash method (Ulvac TC 3000), the three-point bending strength using a bending strength tester, and the volume resistivity using a four-terminal method (in accordance with JIS R1637). As a result, the coefficient of thermal expansion at a temperature of 25° C. to 150° C. was 4.9×100/K, the thermal conductivity at a temperature of 25° C. was 250 W/mK, the three-point bending strength was 350 MPa and the volume specificity was $8 \times 10^{-7}$ Ω-m.

The circumference of the composite material was worked to a cylindrical shape of φ50.8 mm×100 mm using a cylindrical grinder with a diamond grindstone. The resulting cylindrical composite material was sliced into discs of thickness 0.2 mm using a multi-wire saw with diamond abrasive grains at a cutting speed of 0.2 mm/min. The disc-shaped composite material was then ground to a thickness of 0.12 mm using a two-sided grinder with a #600 diamond grindstone, polished to a thickness of 0.1 mm using a lapping machine with diamond abrasive grains, then ultrasonically cleaned in pure water, followed by isopropyl alcohol, and dried to produce a composite material body. Upon measurement of the surface roughness (Ra) with a surface roughness meter, it was found to be Ra 0.04 μm.

Next, the composite material body was subjected to electroless Ni—P and Ni—B plating to form a plating layer (metal layer) of thickness 5 μm (Ni—P: 4 μm+Ni—B: 1 μm) on the surface of the composite material. The properties of the resulting composite material substrate were computed from the law of mixtures by volume ratio based on the physical properties of the plating metal and the physical properties of the composite material body before plating. The results are shown in Table 1. Additionally, the composite material substrate after plating was immersed for one minute in a 5N HCl solution at a temperature of 25° C. and in a 10N NaOH solution at a temperature of 75° C., and the weight decrease per unit area for each process was measured. Furthermore, the surface roughness (Ra) of the composite material substrate after plating was measured. The results are shown in Table 2.

TABLE 1

| | Thermal Conductivity (W/mK) | Coeff. of Linear Thermal Expansion (×10$^{-6}$/K) | Three-Point Bending Strength (MPa) | Volume Resistivity (μΩ-m) |
|---|---|---|---|---|
| Example 1 | 236 | 5.6 | 345 | 0.5 |

TABLE 2

| | Surface Metal Layer | | Weight Decrease (mg/cm$^2$) | | Ra |
|---|---|---|---|---|---|
| | Metal | Thickness (μm) | HCl | NaOH | (μm) |
| Example 1 | Ni—P + Ni—B | 5 | 0 | 0 | 0.05 |

<Production of LED Light Emitting Element>

The process will be explained with reference to the structural diagram of FIG. 1.

On a 0.5 mm thick monocrystalline sapphire substrate 1 (growth substrate), the GaN monocrystals 2-5 as indicated in (1)-(4) below were grown to a thickness of 4 μm by MOCVD at a temperature of 1100° C. using ammonia gas and trimethyl gallium, and a mixture of hydrogen and nitrogen gases as the carrier gas.

| (1) | n-type GaN buffer layer | reference number 2 |
|---|---|---|
| (2) | n-type GaN semiconductor layer | reference number 3 |
| (3) | GaN active layer (light emitting layer) | reference number 4 |
| (4) | p-type GaN semiconductor layer | reference number 5 |

Next, an alloy layer 6 of a silver/tin alloy was deposited to a thickness of 2 μm by vacuum vapor deposition onto the surface of a p-type GaN semiconductor layer 5. On the other hand, an alloy layer 7 of a silver/tin alloy was also deposited to a thickness of 2 μm using a similar method onto the surface on one side of the composite material substrate 8 for an LED light emitting element. As shown in FIG. 1, the substrates were stacked so as to bring the silver/tin alloy layers 6, 7 into contact, and they were bonded by holding for 5 minutes at a temperature of 400° C. at a pressure of 5 MPa. The resulting bonded body was irradiated by a nitrogen gas laser (output 40 MW/cm$^2$) from the sapphire substrate 1 side to strip away the sapphire substrate 1. Due to the laser irradiation, the n-type GaN buffer layer 2 was decomposed into Ga and nitrogen, and the sapphire substrate 1 was able to be stripped by the generated nitrogen gas.

Figure 2:
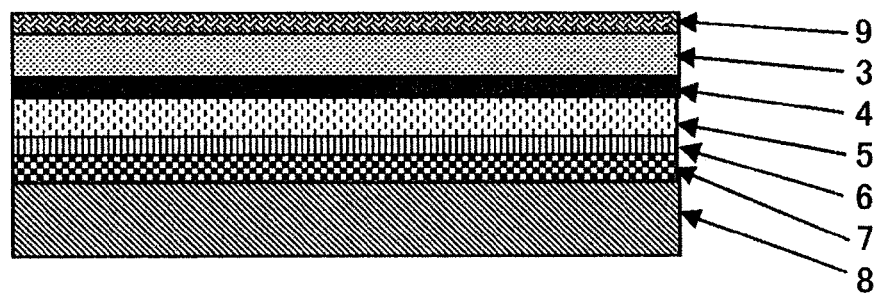
FIG. 2 A view similar to FIG. 1, wherein a transparent conductive layer has been formed after removal of the growth substrate.

Subsequently, the n-type GaN buffer layer 2 that was exposed on the surface was removed by etching to form a transparent conductor layer 9 of indium tin oxide as shown in FIG. 2 (shown upside down with respect to FIG. 1). Then, Au was deposited as an n-type electrode, and the result was diced to form separate LEI) light emitting elements.

Examples 2-12 and Comparative Example 1

The φ50.8 mm×0.1 mmt composite material (composite material before electroless plating) produced in Example 1 was subjected to electroless plating under various conditions to form the metal layers shown in Table 4. The properties of the resulting composite material substrates are shown in Table 3. Additionally, the plated composite material substrate was immersed for 1 minute in a 5N HCl solution at a temperature of 25° C. and a 10N NaOH solution at a temperature of 75 and the weight decrease per unit area for each process was measured. Then, the surface roughnesses (Ra) of the plated composite material substrates were measured using a surface roughness meter. The results are shown in Table 4. Note that in Table 4, Comparative Example 1 indicates the test results for a composite material on which a metal layer has not been formed.

TABLE 3

| | Thermal Conductivity (W/mK) | Coeff. of Linear Thermal Expansion (×10$^{-6}$/K) | Three-Point Bending Strength (MPa) | Volume Resistivity (μΩ-m) |
|---|---|---|---|---|
| Example 2 | 248 | 5.0 | 350 | 0.8 |
| Example 3 | 244 | 5.2 | 348 | 0.8 |
| Example 4 | 224 | 6.2 | 342 | 0.7 |
| Example 5 | 213 | 6.7 | 338 | 0.6 |
| Example 6 | 240 | 5.6 | 341 | 0.7 |
| Example 7 | 254 | 5.7 | 328 | 0.7 |
| Example 8 | 265 | 6.2 | 332 | 0.7 |
| Example 9 | 263 | 6.0 | 343 | 0.7 |
| Example 10 | 234 | 5.3 | 331 | 0.7 |
| Example 11 | 230 | 7.1 | 321 | 0.7 |
| Example 12 | 236 | 5.6 | 364 | 0.7 |
| Comparative Example 1 | 250 | 4.9 | 350 | 0.8 |

TABLE 4

| | Surface Metal Layer | | Weight Decrease (mg/cm$^2$) | | |
|---|---|---|---|---|---|
| | Metal | Thickness (μm) | HCl | NaOH | Ra (μm) |
| Example 2 | Ni | 0.5 | 0 | 0.02 | 0.04 |
| Example 3 | Ni | 2 | 0 | 0 | 0.05 |
| Example 4 | Ni | 10 | 0 | 0 | 0.05 |
| Example 5 | Ni | 15 | 0 | 0 | 0.06 |
| Example 6 | Ni + Au | 4 + 1 | 0 | 0 | 0.05 |
| Example 7 | Au | 5 | 0 | 0 | 0.05 |
| Example 8 | Ag | 5 | 0 | 0 | 0.05 |
| Example 9 | Cu | 5 | 0.01 | 0 | 0.04 |
| Example 10 | Pt | 5 | 0 | 0 | 0.04 |
| Example 11 | Pd | 5 | 0 | 0 | 0.06 |
| Example 12 | Co | 5 | 0 | 0 | 0.05 |
| Comparative Example 1 | — | — | 0.10 | 1.05 | 0.05 |

Example 13

A 1 μm Au layer was formed by vapor deposition on the surface of the φ50.8 mm×0.1 mmt composite material produced in Example 1. The properties of the resulting composite material substrate are shown in Table 5. Additionally, an evaluation similar to that of Example 1 was performed on the resulting composite material substrate. The results are shown in Table 6.

TABLE 5

| | Thermal Conductivity (W/mK) | Coeff. of Linear Thermal Expansion (×10$^{-6}$/K) | Three-Point Bending Strength (MPa) | Volume Resistivity (μΩ-m) |
|---|---|---|---|---|
| Example 13 | 251 | 5.1 | 345 | 0.8 |
| Example 14 | 243 | 5.3 | 347 | 0.8 |
| Example 15 | 243 | 5.3 | 347 | 0.8 |
| Example 16 | 247 | 5.1 | 348 | 0.8 |

TABLE 6

| | Surface Metal Layer | | Weight Decrease (mg/cm$^2$) | | |
|---|---|---|---|---|---|
| | Metal | Thickness (μm) | HCl | NaOH | Ra (μm) |
| Example 13 | Au | 1 | 0 | 0 | 0.04 |
| Example 14 | Ni | 5 | 0 | 0 | 0.05 |
| Example 15 | Ni | 5 | 0 | 0 | 0.05 |
| Example 16 | Ni | 3 | 0 | 0 | 0.04 |

Example 14

Two pieces of the φ50.8 mm×0.1 mmt composite material produced in Example 1 were bonded together with a wax-based adhesive, the surface was cleaned, then subjected to electroless Ni—P plating to form a 5 μm Ni—P layer on the exposed surfaces. After the plating process, the wax-based adhesive was removed to obtain a composite substrate having metal layers on one main surface and the side surfaces. The properties of the resulting composite material substrate are shown in Table 5. Additionally, the non-plated surfaces of the resulting composite material substrate were covered by a chemical resistant tape, and evaluations similar to those of Example 1 were performed. The results are shown in Table 6 above.

Example 15

One main surface of the φ50.8 mm×0.1 mmt composite material produced in Example 1 was covered by a plating resist, then the surface was cleaned and subjected to electroless Ni—P plating to form a 5 μm Ni—P layer on the surface. After the plating process, the plating resist was removed with acetone to obtain a composite substrate having metal layers on one main surface and the side surfaces. The properties of the resulting composite material substrate are shown in Table 5. Additionally, the non-plated surfaces of the resulting composite material substrate were covered by a chemical resistant tape, and evaluations similar to those of Example 1 were performed. The results are shown in Table 6 above.

Example 16

The composite material produced in Example 1 was worked to a shape of φ50.8 mm×0.2 mmt, then the surface was cleaned and subjected to electroless Ni—P plating to form a 3 μm Ni—P layer on the surface. Thereafter, grinding was performed to a thickness of 0.1 mm using a planar grinder with a #800 diamond grindstone to obtain a composite substrate having metal layers on one main surface and the side surfaces. The properties of the resulting composite material substrate are shown in Table 5. Additionally, the non-plated surfaces of the resulting composite material substrate were covered by a chemical resistant tape, and evaluations similar to those of Example 1 were performed. The results are shown in Table 6 above.

Examples 17-20, Comparative Examples 2-4

<Production of Composite Material Substrate for LED Light Emitting Element>

1300 g of a silicon carbide powder D (Pacific Rundum NG-80, average grain size 150 μm), 700 g of a silicon carbide powder E (Yakushima Denko GC-1000F, average grain size 10 μm) and 300 g of a silica sol (Nissan Chemical Snowtex) were measured out and mixed for 30 minutes in an agitation mixer, then press-molded at a surface pressure of 30 MPa into a cylindrical shape of dimensions φ60 mm×55 mm to form a molded body. The resulting molded body was dried for 1 hour at a temperature of 120° C., and baked for 2 hours at a temperature of 1400° C. in a nitrogen atmosphere to obtain an SiC preform of porosity 35%. The resulting SiC preform was worked to a shape with outer dimensions φ52 mm×50 mm using a machining center with a diamond grindstone. The resulting SIC preform was ground to produce a sample (3 mm×4 mm×40 mm) for measurement of three-point bending strength, and the three-point bending strength was measured. The three-point bending strength was 50 MPa.

A boron nitride mold release agent was applied to the resulting SiC preform, which was then inserted into a tubular iron jig of outer dimensions 70 mm×70 mm×50 mm (inner dimensions φ52.5 mm×50 mm) to form a structure. Next, a graphite mold release material was applied to a stainless steel plate of 70 mm×70 mm×0.8 mmt to form a mold release plate, and four structures were stacked with the mold release plate sandwiched in between to form a shape of dimensions 140.8 mm×140.8 mm×50 mm. 12 mm thick iron plates were provided on both sides thereof with 10 mm thick ceramic boards having a ceramic fiber content of 10 vol % sandwiched in between, and the entirety was joined together by eight M10 bolts to result in a single stacking block.

Next, the stacking block was preheated in an electrical furnace to various temperatures indicated in Table 7, then placed in a preheated press mold of inner dimensions φ400 mm×300 mmH, an aluminum alloy melt (temperature 800° C.) containing 12 mass % of silicon and 1 mass % of magnesium was poured in, and the stacking block was compressed for 25 minutes at the respective pressures indicated in Table 7 to infiltrate the SiC preform with the aluminum alloy. After cooling to room temperature, the stacking block was cut along the shape of the mold release plates using a wet band-type saw, the mold release plates and iron jigs were stripped, then the aluminum alloy layers containing 10 vol % of ceramic fibers on both sides were removed by machining to result in a composite material of dimensions φ52.5 mm×50 mm. The resulting composite material was annealed for three hours at a temperature of 530° C. to remove residual stress from infiltration.

TABLE 7

| | Preheat Temperature (° C.) | Infiltration Pressure (MPa) |
|---|---|---|
| Examples 1-16 | 700 | 100 |
| Example 17 | 600 | 100 |
| Example 18 | 650 | 30 |
| Example 19 | 650 | 100 |
| Example 20 | 800 | 100 |
| Example 21 | 700 | 100 |
| Example 22 | 700 | 100 |
| Example 23 | 700 | 100 |
| Example 24 | 700 | 100 |
| Example 25 | 700 | 100 |
| Comparative Example 1 | 700 | 100 |
| Comparative Example 2 | 500 | 100 |
| Comparative Example 3 | 1000 | 100 |
| Comparative Example 4 | 650 | 10 |

Next, the resulting composite material was ground to produce a sample for measuring the coefficient of thermal expansion (diameter 3 mm, length 10 mm), a sample for measuring thermal conductivity (25 mm×25 mm×1 mm), a sample for measuring the three-point bending strength (3 mm×4 mm×40 mm) and a sample for measuring the volume resistivity (50 mm×50 mm×5 mm). The respective samples were used to measure the coefficient of thermal expansion at temperatures of 25° C. to 150° C., the thermal conductivity at a temperature of 25° C., the three-point bending strength, and the volume resistivity using the same methods as Example 1. Comparative Example 2 was not able to retain its shape when working the sample, so its properties were not able to be evaluated.

The circumference of the resulting composite material was worked to a cylindrical shape of φ50.8 mm×50 mm using a cylindrical grinder with a diamond grindstone. Next, the cylindrical composite material was sliced into discs of thickness 0.25 mm using an inner diameter cutter with a diamond blade at a cutting speed of 5 mm/min. The disc-shaped composite material was then ground to a thickness of 0.2 mm using a two-sided grinder with a #800 diamond grindstone.

Next, the surface of the composite material was cleaned, and electroless Ni—P and Ni—B plating was performed to form a plating layer of thickness 4 μm (Ni—P: 3 μm+Ni—B: 1 μm) on the surface of the composite material. The properties of the resulting composite material are shown in Table 8. Additionally, the results of evaluations similar to those of Example 1 are shown in Table 9.

TABLE 8

| | Thermal Conductivity (W/mK) | Coeff. of Linear Thermal Expansion (×10⁻⁶/K) | Three-Point Bending Strength (MPa) | Volume Resistivity (μΩ-m) |
|---|---|---|---|---|
| Example 17 | 196 | 7.8 | 358 | 0.3 |
| Example 18 | 186 | 7.7 | 348 | 0.3 |
| Example 19 | 196 | 7.7 | 396 | 0.3 |
| Example 20 | 186 | 7.6 | 387 | 0.3 |
| Example 21 | 217 | 5.3 | 319 | 0.9 |
| Example 22 | 192 | 6.5 | 281 | 0.5 |
| Example 23 | 167 | 4.8 | 396 | 0.1 |
| Example 24 | 500 | 6.7 | 281 | 0.4 |
| Example 25 | 238 | 5.2 | 81 | 8.8 |
| Comparative Example 2 | — | — | — | |
| Comparative Example 3 | 95 | 7.2 | 252 | 0.5 |
| Comparative Example 4 | 95 | 8.0 | 204 | 0.5 |

TABLE 9

| | Surface Metal Layer | | Weight Decrease(mg/cm²) | | |
|---|---|---|---|---|---|
| | Metal | Thickness (μm) | HCl | NaOH | Ra (μm) |
| Example 17 | Ni | 4 | 0 | 0 | 0.05 |
| Example 18 | Ni | 4 | 0 | 0 | 0.06 |
| Example 19 | Ni | 4 | 0 | 0 | 0.05 |
| Example 20 | Ni | 4 | 0 | 0 | 0.06 |
| Example 21 | Ni | 4 | 0 | 0 | 0.05 |
| Example 22 | Ni | 4 | 0 | 0 | 0.05 |
| Example 23 | Ni | 4 | 0 | 0 | 0.06 |
| Example 24 | Ni | 4 | 0 | 0 | 0.06 |
| Example 25 | Ni | 4 | 0 | 0 | 0.05 |
| Comparative Example 2 | — | — | — | — | — |
| Comparative Example 3 | Ni | 4 | 0 | 0 | 0.06 |
| Comparative Example 4 | Ni | 4 | 0 | 0 | 0.07 |

<Production of LED Light Emitting Element>

Figure 3:
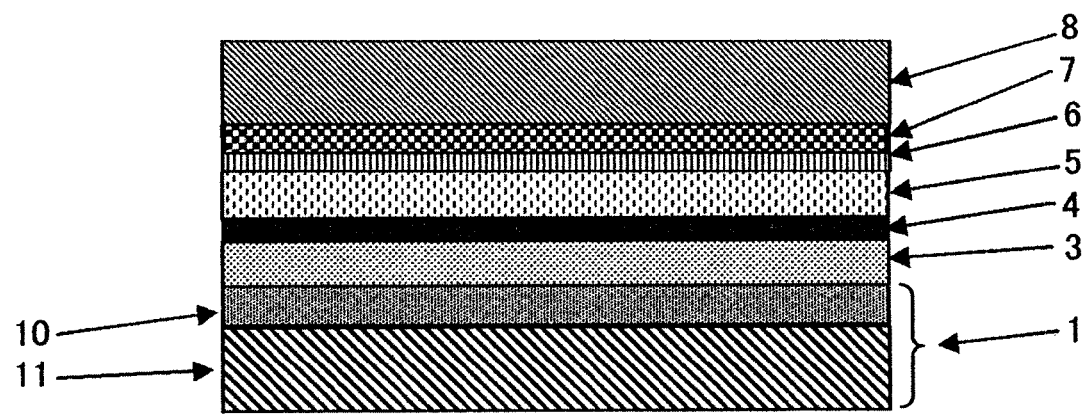
FIG. 3 A schematic section view for explaining an example of the structure of an LED light emitting element according to Example 17 of the present invention, wherein a composite material substrate according to an embodiment of the present invention has been bonded to a semiconductor layer formed on a Si growth substrate.

Next, an example of production of an LED light emitting element using the composite material substrate for an LED light emitting element of Example 17 shall be described with reference to FIG. 3 where appropriate.

2 μm of an SiC layer (surface coating layer) 10 were formed by CVD on a 0.5 mm thick monocrystalline Si substrate 11 to produce a growth substrate 1, then the GaN monocrystals 3-5 as indicated in (1)-(3) below were grown to a thickness of 4 μm by HVPE at a temperature of 1050° C. using ammonia gas and gallium chloride, and hydrogen as the carrier gas.

(1) n-type GaN semiconductor layer — reference number 3
(2) GaN active layer (light emitting layer) — reference number 4
(3) p-type GaN semiconductor layer — reference number 5

Next, silver was deposited to a thickness of 0.5 μm and an alloy layer 6 of a Au/tin alloy was deposited to a thickness of 1.5 μm by vacuum vapor deposition onto the surface of a p-type GaN semiconductor layer 5. On the other hand, an alloy layer 7 of a Au/tin alloy was also deposited to a thickness of 1.5 μm using a similar method onto the surface on one side of the composite material substrate 8 for an LED light emitting element according to Example 17. The substrates were stacked so as to bring the Au/tin alloy layers 6, 7 into contact, and they were bonded by holding for 5 minutes at a temperature of 500° C. at a pressure of 5 MPa. The resulting bonded body was subjected to an acid treatment to etch away the monocrystalline Si layer, then the SiC layer was completely removed by grinding.

Subsequently, the exposed surface of the n-type GaN layer 3 was removed by etching and the surface was roughened, after which a transparent conductor layer of indium tin oxide was formed. Then, Au was deposited as an n-type electrode, and the result was laser-processed to form separate LED light emitting elements.

Example 21

1800 g of a silicon carbide powder A (average grain size 200 μm), 900 g of a silicon carbide powder B (average grain size 20 μm), 300 g of an aluminum nitride powder (Tokuyama, F grade, average grain size 2 μm) and 150 g of a mold binder (methylcellulose) were measured out, mixed for 30 minutes in an agitation mixer, then press-molded at a surface pressure of 10 MPa into the shape of a cylinder of dimensions φ55 mm×110 mm, then CIP-molded at a molding pressure of 100 MPa to produce a molded article.

The resulting molded article was degreased for 2 hours at a temperature of 600° C. in air, then baked for 2 hours at a temperature of 1950° C. in an argon atmosphere to produce an SIC preform of porosity 15%. The resulting preform was worked using a diamond grindstone in a machining center to a form having outer dimensions φ52 mm×100 mm. This was further ground to produce a three-point bending strength measuring sample (3 mm×4 mm×40 mm), and the three-point bending strength was measured. The three-point bending strength was 125 MPa.

The resulting preform was processed using methods similar to Example 1 (see Table 7 for preheat temperature and infiltration pressure) to obtain a composite material for an LED light emitting element of shape φ52 mm×100 mm. Samples were produced from the resulting composite material for an LED light emitting element in a manner similar to Example 1 and their properties were evaluated.

Next, the circumference of the resulting composite material for an LED light emitting element was worked to a cylindrical shape of φ50.8 mm×100 mm using a cylindrical grinder with a diamond grindstone, then formed into a disc of thickness 0.15 mm in a manner similar to Example 1. Next, the disc-shaped composite material for an LED light emitting element was polished to a thickness of 0.1 mm using a lapping machine with diamond abrasive grains to produce a composite material substrate for an LED light emitting element.

Next, the surface of the composite material was cleaned, and electroless Ni—P and Ni—B plating was performed to form a plating layer of thickness 4 μm (Ni—P: 3 μm+Ni—B: 1 μm) on the surface of the composite material. The properties of the resulting composite material are shown in Table 8. Additionally, the results of evaluations similar to those of Example 1 are shown in Table 9.

Example 22

2880 g of an aluminum nitride powder (average grain size 2 μm), 120 g of an yttrium oxide powder (Shin-etsu Rare Earth, UU grade, average grain size 1 μm), 150 g of a mold binder (methylcellulose) and 150 g of pure water were measured out, mixed for 30 minutes in an agitation mixer, then press-molded at a surface pressure of 10 MPa into the shape of a cylinder of dimensions φ55 mm×110 mm, then CIP-molded at a molding pressure of 100 MPa to produce a molded article.

The resulting molded article was degreased for 2 hours at a temperature of 600° C. in air, then baked for 4 hours at a temperature of 1780° C. in a nitrogen atmosphere to produce a preform of porosity 22%. The resulting preform was worked using a diamond grindstone in a machining center to a form having outer dimensions φ52 mm×100 mm. The resulting preform was ground to produce a three-point bending strength measuring sample (3 mm×4 mm×40 mm), and the three-point bending strength was measured. The three-point bending strength was 90 MPa.

The resulting preform was processed using methods similar to Example 1 (see Table 7 for preheat temperature and infiltration pressure), except that pure aluminum was used instead of an aluminum alloy, to obtain a composite material for an LED light emitting element of shape φ52 mm×100 mm. Samples were produced from the resulting composite material for an LED light emitting element in a manner similar to Example 1 and their properties were evaluated.

Next, the circumference of the resulting composite material for an LED light emitting element was worked to a cylindrical shape of φ50.8 mm×100 mm using a cylindrical grinder with a diamond grindstone, then formed into a disc of thickness 0.15 mm in a manner similar to Example 1. Next, the disc-shaped composite material for an LED light emitting element was polished to a thickness of 0.1 mm using a lapping machine with diamond abrasive grains to produce a composite material substrate for an LED light emitting element.

Next, the surface of the composite material was cleaned, and electroless Ni—P and Ni—B plating was performed to form a plating layer of thickness 4 μm (Ni—P: 3 μm+Ni—B: 1 μm) on the surface of the composite material. The properties of the resulting composite material are shown in Table 8. Additionally, the results of evaluations similar to those of Example 1 are shown in Table 9.

Example 23

2790 g of a silicon nitride powder (Denki Kagaku Kogyo, NP-200, average grain size 1 μm), 150 g of an yttrium oxide powder (average grain size 1 μm) and 60 g of a magnesium oxide powder (Iwatani Kagaku, MJ-30, average grain size 1 μm) were measured out, mixed for 30 minutes in an agitation mixer, then press-molded at a surface pressure of 10 MPa into the shape of a cylinder of dimensions φ55 mm×10 mm, then CIP-molded at a molding pressure of 100 MPa to produce a molded article.

The resulting molded article was baked for 4 hours at a temperature of 1880° C. in a 0.9 MPa nitrogen atmosphere to produce a preform of porosity 13%. The resulting preform was worked using a diamond grindstone in a machining center to a form having outer dimensions φ52 mm×5 mm. The resulting preform was ground to produce a three-point bending strength measuring sample (3 mm×4 mm×40 mm), and the three-point bending strength was measured. The three-point bending strength was 150 MPa.

Next, the resulting preform was processed using methods similar to Example 1 (see Table 7 for preheat temperature and infiltration pressure), to obtain a composite material for an LED light emitting element of shape φ52 mm×10 mm. Samples were produced from the resulting composite material for an LED light emitting element in a manner similar to Example 1 and their properties were evaluated.

The circumference of the resulting composite material for an LED light emitting element was worked into the shape of a disc of φ50.8 mm×5 mm using a water-jet cutter. Next, the material was ground into the form of a disc of thickness 0.22 mm using a planar grinder with a #230 diamond grindstone, then ground to a thickness of 0.2 mm using a #800 diamond grindstone to produce a composite material substrate for an LED light emitting element.

Next, the surface of the composite material was cleaned, and electroless Ni—P and Ni—B plating was performed to form a plating layer of thickness 4 μm (Ni—P: 3 μm+Ni—B: 1 μm) on the surface of the composite material. The properties of the resulting composite material are shown in Table 8. Additionally, the results of evaluations similar to those of Example 1 are shown in Table 9.

Example 24

7 g of a diamond powder A (Diamond Innovations, MBG-600, average grain size 120 μm) and 3 g of a diamond powder B (Diamond Innovations, MGB-600, average grain size 15 μm) were mixed for 10 minutes in an alumina mortar, and after inserting a graphite jig (2) of outer dimensions φ52.4 mm×9 mm into a tubular graphite jig (1) of outer dimensions 70 mm×70 mm×20 mm (inner dimensions φ52.5 mm×20 mm), 10 g of the mixed diamond powder were loaded, and the graphite jig (2) was further inserted on the top surface of the mixed diamond powder to form a structure. Next, a graphite mold release material was applied to a 70 mm×70 mm×0.8 mmt stainless steel plate to produce mold release plates, and the structure was stacked with the mold release plates sandwiched in between and 12 mm thick iron plates placed on the top and bottom, then joined by eight M10 bolts to form a single stacking block.

Next, this stacking block was treated by a method similar to Example 1 (see Table 7 for preheat temperature and infiltration pressure) to obtain a composite material for an LED light emitting element of the form 70 mm×70 mm×20 mm with its periphery surrounded by a graphite jig. The resulting composite material for an LED light emitting element had a structure surrounded by a graphite jig, and was ground using a planar grinder with a diamond grindstone from both main surfaces (70 mm×70 mm) until the composite material consisting of aluminum-diamond was exposed, resulting in a plate of form 70 mm×70 mm×2 mmt. Next, the circumference of the resulting composite material for an LED light emitting element was worked into the shape of a disc of φ50.8 mm×2 mm using a water-jet cutter.

Next, the resulting composite material for an LED light emitting element was ground to produce a sample for measuring the coefficient of thermal expansion (2 mm×3 mm×10 mm), a sample for measuring thermal conductivity (25 mm×25 mm×1 mm), a sample for measuring the three-point bending strength (2 mm×4 mm×40 mm) and a sample for measuring the volume resistivity (35 mm×35 mm×2 mm). The respective samples were used to perform evaluations in the same manner as Example 1.

The resulting composite material for an LED light emitting element was ground into the form of a disc of thickness 0.16 mm using a planar grinder with a #230 diamond grindstone, then the resulting composite material for an LED light emitting element was ground to a thickness of 0.15 mm using a #400 diamond grindstone.

Next, the surface of the composite material was cleaned, and electroless Ni—P and Ni—B plating was performed to form a plating layer of thickness 4 μm (Ni—P: 3 μm+Ni—B: 1 μm) on the surface of the composite material. The properties of the resulting composite material are shown in Table 8. Additionally, the results of evaluations similar to those of Example 1 are shown in Table 9.

Example 25

A graphite mold release material was applied to a 100 mm×100 mm×0.8 mmt stainless steel plate to produce mold release plates, and 12 mm thick iron plates were placed on both sides of a 100 mm×100 mm×100 mm isotropic graphite molded article (Tokai Carbon, 6458, porosity 13 vol %) with the mold release plates sandwiched therebetween, and joined by eight M10 bolts to form a single stacking block. Next, this stacking block was processed using methods similar to those of Example 1 (see Table 7 for preheating temperature and infiltration pressure) to obtain a composite material of shape 100 mm×100 mm×100 mm. The resulting composite material was used to produce samples in a manner similar to Example 1, and the properties were evaluated.

The resulting composite material for an LED light emitting element was cut with a diamond saw and its circumference was worked to a cylindrical shape of φ50.8 mm×100 mm using a cylindrical grinder with a diamond grindstone. The resulting cylindrical composite material for an LED light emitting element was sliced into discs of thickness 0.4 mm using a multi-wire saw with diamond abrasive grains at a cutting speed of 0.5 mm/min. The resulting disc-shaped composite material for an LED light emitting element was ground to a thickness of 0.3 mm using a two-sided grinder with a #600 diamond grindstone to obtain a composite material substrate for an LED light emitting element.

Next, the surface of the composite material was cleaned, and electroless Ni—P and Ni—B plating was performed to form a plating layer of thickness 4 μm (Ni—P: 3 μm+Ni—B: 1 μm) on the surface of the composite material. The properties of the resulting composite material are shown in Table 8. Additionally, the results of evaluations similar to those of Example 1 are shown in Table 9.

DESCRIPTION OF REFERENCE NUMBERS

1 growth substrate
2 nitride buffer layer formed on growth substrate
3 n-type III-V semiconductor layer
4 light emitting layer
5 p-type III-V semiconductor layer
6 alloy layer (reflective layer)
7 alloy layer
8 composite material substrate
9 transparent conductor layer
10 surface coating layer
11 substrate

The invention claimed is:
1. A composite material substrate, formed by a process comprising:
 (a) heating a porous body at a temperature of from about 600 to 800° C.,
 (b) infiltrating cavities of the porous body with an aluminum alloy having an aluminum content of at least 70 mass % or pure aluminum to form an infiltrated body,
 (c) working the infiltrated body to form a composite material of predetermined thickness and a surface roughness (Ra) of 0.01 to 0.5 μm, then
 (d) forming, on a surface of the composite material to a thickness of 0.5 to 2 μm and a surface roughness (Ra) of 0.01 to 0.5 μm, a metal layer comprising Ni, wherein:
the porous body has a porosity of 10 to 50 vol % and comprises silicon carbide.

2. The composite material substrate of claim 1, wherein the porous body has a three-point bending strength of at least 50 MPa, and the porous body is infiltrated with the aluminum alloy or pure aluminum by squeeze casting at an infiltration pressure of at least 30 MPa.

3. The composite material substrate of claim 1, wherein the composite material has a thickness of 0.05 to 0.5 mm and a surface roughness (Ra) of 0.01 to 0.5 μm.

4. The composite material substrate of claim 1, wherein the composite material has a thickness of 0.05 to 0.5 mm.

5. The composite material substrate of claim 1, wherein the composite material substrate has:
a thermal conductivity of 100 to 500 W/mK at a temperature of 25° C.,
a coefficient of linear thermal expansion of 4 to $9\times10^{-6}$/K at a temperature of 25° C. to 150° C.,
a three-point bending strength of at least 50 MPa, and
a volume resistivity of $10^{-9}$ to $10^{-5}$ Ω-m.

6. The composite material substrate of claim 5, wherein the composite material substrate has:
a thickness of 0.05 mm to 0.5 mm,
a surface roughness (Ra) of 0.01 to 0.5 μm on at least one main surface, and
a weight decrease of at most 0.2 mg/cm$^2$ on the at least one main surface when immersed for 1 minute respectively in a 5N HCl solution at a temperature of 25° C. and a 10N NaOH solution at a temperature of 75° C.

7. A method of producing a composite material substrate, the method comprising:
(a) preparing a porous body having a porosity of 10 to 50 vol % and comprising silicon carbide;
(b) heating the porous body at a temperature of from about 600 to 800° C.,
(c) forming a composite material by infiltrating cavities of the porous body with an aluminum alloy having an aluminum content of at least 70 mass % or pure aluminum and working to a predetermined thickness and a surface roughness (Ra) of 0.01 to 0.5 μm; and
(d) forming, on a surface of the composite material to a thickness of 0.5 to 2 μm and a surface roughness (Ra) of 0.01 to 0.5 μm, a metal layer comprising Ni.

8. The method of claim 7, wherein:
the porous body has a three-point bending strength of at least 50 MPa, and
the porous body is infiltrated with the aluminum alloy or pure aluminum by squeeze casting at an infiltration pressure of at least 30 MPa.

9. The method of claim 7, wherein the composite material is worked to a thickness of 0.05 to 0.5 mm and a surface roughness (Ra) of 0.01 to 0.5 μm.

10. The method of claim 7, wherein:
the composite material is worked to a thickness of 0.05 to 0.5 mm and a surface roughness (Ra) of 0.01 to 2 μm.

11. The composite material substrate of claim 1, wherein the porous body consists of silicon carbide.

12. The composite material substrate of claim 1, wherein an aluminum alloy or pure aluminum heated to above the melting point is poured and compressed at a pressure of at least 30 MPa is used in carrying out (b).

13. The method of claim 7, wherein an aluminum alloy or pure aluminum heated to above the melting point is poured and compressed at a pressure of at least 30 MPa is used in carrying out (b).

* * * * *